United States Patent
Kuang et al.

(10) Patent No.: US 9,246,491 B2
(45) Date of Patent: Jan. 26, 2016

(54) METHOD AND APPARATUS FOR PERFORMING PIPELINED OPERATIONS ON PARALLEL INPUT DATA WITH FEEDBACK

(75) Inventors: Qicheng Kuang, Shanghai (CN); Qianlin Shang, Shanghai (CN)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 14/416,406

(22) PCT Filed: Jul. 27, 2012

(86) PCT No.: PCT/CN2012/079268
§ 371 (c)(1),
(2), (4) Date: Jan. 22, 2015

(87) PCT Pub. No.: WO2014/015516
PCT Pub. Date: Jan. 30, 2014

(65) Prior Publication Data
US 2015/0207507 A1    Jul. 23, 2015

(51) Int. Cl.
*H03M 13/00*    (2006.01)
*H03K 19/0175*    (2006.01)
*H03K 19/177*    (2006.01)
*H03K 19/21*    (2006.01)

(52) U.S. Cl.
CPC .. *H03K 19/017509* (2013.01); *H03K 19/17728* (2013.01); *H03K 19/21* (2013.01)

(58) Field of Classification Search
CPC ..... H04L 1/0061; H03M 13/09; H03K 19/21; H03K 5/135
See application file for complete search history.

(56) References Cited

U.S. PATENT DOCUMENTS

| | | | |
|---|---|---|---|
| 2005/0268209 A1 | 12/2005 | Mann | |
| 2006/0168496 A1* | 7/2006 | Steele et al. | 714/758 |
| 2007/0234177 A1* | 10/2007 | Jeon et al. | 714/758 |
| 2008/0065959 A1 | 3/2008 | Pisek et al. | |
| 2012/0030548 A1* | 2/2012 | Zhang | 714/807 |

FOREIGN PATENT DOCUMENTS

| | | |
|---|---|---|
| CN | 101527615 A | 9/2009 |
| CN | 101854222 A | 10/2010 |

OTHER PUBLICATIONS

International Search Report for PCT/CN2012/079268 dated May 9, 2013.

* cited by examiner

Primary Examiner — Jason M Crawford
(74) Attorney, Agent, or Firm — Fay Sharpe LLP

(57) ABSTRACT

Embodiments of the claimed subject matter provide a method and apparatus for performing pipelined operations on input data with feedback. One embodiment of the apparatus includes a first logic circuit for determining a value of a first function based on input data for a first clock cycle. The first logic circuit includes pipeline stages that perform subsets of calculations of the value of the first function in one clock cycle. The apparatus also includes a second logic circuit for determining a value of a second function for the first clock cycle based on a value of a third function for a second clock cycle prior to the first clock cycle. The apparatus further includes a third logic circuit for determining a value of the third function for the first clock cycle by combining the values of the first and second functions for the first clock cycle.

20 Claims, 11 Drawing Sheets

METHOD AND APPARATUS FOR PERFORMING PIPELINED OPERATIONS ON PARALLEL INPUT DATA WITH FEEDBACK

BACKGROUND

This application relates generally to packet-based networks, and, more particularly, to processing parallel input data using feedback in packet-based networks.

Processor-based systems from personal computers to mainframes may include a wide variety of components that are interconnected using cabling, buses, bridges, or other networking elements such as routers, repeaters, or switches. The interconnections may be used to form packet-based networks of processor-based systems such as wide area networks (WANs), local area networks (LANs), and the like. For example, processor-based systems or logic circuits within the systems may exchange packets of data over an Ethernet, which is a family of computer networking technologies for LANs. Ethernet was commercially introduced in 1980 and standardized in 1985 as IEEE 802.3. The Ethernet standards support several wiring and signaling variants of the Open Systems Interconnection (OSI) physical layer. The original 10BASE5 Ethernet used coaxial cable as a shared medium. Later versions of Ethernet use twisted pair and fiber optic links in conjunction with hubs or switches as the shared medium. Data packets transmitted on an Ethernet may be called Ethernet frames. Each packet or frame includes source and destination addresses and error-checking data so that damaged data can be detected and re-transmitted.

Packet-based networks may also transmit packets or frames according to other protocols. For example, packet-based networks may exchange packets or frames using the Generic Framing Procedure (GFP) defined by the International Telecommunication Union (ITU) Telecommunication Standardization Sector (ITU-T) G.7041. For another example, packet-based networks may exchange packets or frames using the 10 Gbit/s Ethernet Passive Optical Network (10G-EPON) standard that supports data transmission in two configurations: a symmetric configuration that operates at a data rate of 10 Gbit/s in the upstream (customer-to-provider) and downstream (provider-to-customer) directions and an asymmetric configuration that operates at 10 Gbit/s in the downstream direction and 1 Gbit/s in the upstream direction. The 10G-EPON standard was ratified as IEEE 802.3av standard in 2009.

Data transmission rates have steadily increased and are expected to continue to increase. For example, early versions of Ethernet transmitted data at a maximum rate of approximately 10 Mbps and subsequent versions increased the data transmission rate from 100 Mbps to the current maximum data rate of 100 Gbps. Limitations on the clock frequency used for the data transfer result in a corresponding increase in the width of the parallel data paths used to carry the transmitted data. For example, a parallel input data path to an FPGA circuit that uses a 125 MHz clock frequency needs to be eight bits wide to support a data transfer rate of 1 Gbps=8×125 MHz. Further increases in the data transfer rate would require increases in either the clock frequency or the width of the parallel data path. In cases where the maximum clock frequency is limited, such as FPGA circuits, the only way to increase the data transfer rate is to increase the width of the parallel data path.

Logic functions along the data path may compute output values using input data values and feedback from entities further along the data path. The logic function may be required to process the input values and the feedback in a single clock cycle. For example, error checking or correction can be performed using a cyclic redundancy check (CRC) calculation that is performed using input data for the current clock cycle and previous values of the CRC calculation. The previous CRC values may be stored in a register that is downstream from the logic that calculates the CRC value. Consequently, the CRC logic should perform the CRC calculation and store the output value in a register in a single cycle so that the output value of the CRC can be fed back and used to compute the CRC value for the next clock cycle. For another example, frames that use the GFP standard may include a frame check sequence (FCS) that includes extra checksum characters for error detection. For yet another example, the 10G-EPON standard employs a stream-based forward error correction (FEC) mechanism based on Reed-Solomon coding for upstream and downstream channels in the symmetric configuration and downstream channels in the asymmetric configuration. Upstream channels in the asymmetric EPON may use an optional frame-based FEC using Reed-Solomon coding.

SUMMARY OF EMBODIMENTS

The disclosed subject matter is directed to addressing the effects of one or more of the problems set forth above. The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In one embodiment, an apparatus is provided for performing pipelined operations on input data with feedback. One embodiment of the apparatus includes a first logic circuit for determining a value of a first function based on input data for a first clock cycle. The first logic circuit includes pipeline stages that perform subsets of calculations of the value of the first function in one clock cycle. The apparatus also includes a second logic circuit for determining a value of a second function for the first clock cycle based on a value of a third function for a second clock cycle prior to the first clock cycle. The apparatus further includes a third logic circuit for determining a value of the third function for the first clock cycle by combining the values of the first and second functions for the first clock cycle.

In another embodiment, an interface is provided. One embodiment of the interface includes a plurality of ports for receiving parallel input data and a first logic circuit for determining a value of a first function based on the parallel input data for a first clock cycle. The first logic circuit includes a plurality of pipeline stages that perform subsets of calculations of the value of the first function in one clock cycle. The interface also includes a second logic circuit for determining a value of a second function for the first clock cycle based on a value of a third function for a second clock cycle prior to the first clock cycle. The interface also includes a third logic circuit for determining a value of the third function for the first clock cycle by combining the values of the first and second functions for the first clock cycle. At least one register is included for storing the value of the third function.

In yet another embodiment, a method of providing for handling pipelined data with feedback. One embodiment of the method includes determining a value of a first function based on input data for a first clock cycle. The value of the first function is determined using a plurality of pipeline stages that perform subsets of calculations of the value of the first function in one clock cycle. The method also includes determining a value of a second function for the first clock cycle based on a value of a third function for a second clock cycle prior to the first clock cycle. The method further includes determining a value of the third function for the first clock cycle by combining the values of the first and second functions for the first clock cycle.

In a further embodiment, an apparatus is provided for performing pipelined operations on input data with feedback. One embodiment of the apparatus includes a first logic circuit for determining a value of a first function based on input data for a first clock cycle. The first logic circuit includes pipeline stages that perform subsets of calculations of the value of the first function in one clock cycle. The first function is derived from a generating function for a cyclic redundancy check (CRC). This embodiment of the apparatus also includes a second logic circuit for determining a value of a second function for the first clock cycle based on a CRC value for a second clock cycle prior to the first clock cycle. The second function is derived from the generating function. This embodiment of the apparatus further includes a third logic circuit for determining a CRC value for the first clock cycle by combining the values of the first and second functions for the first clock cycle.

In another further embodiment, a method of providing for handling pipelined data with feedback. One embodiment of the method includes determining a value of a first function based on input data for a first clock cycle. The value of the first function is determined using a plurality of pipeline stages that perform subsets of calculations of the value of the first function in one clock cycle. The first function is derived from a generating function for a cyclic redundancy check (CRC). This embodiment of the method also includes determining a value of a second function for the first clock cycle based on a CRC value for a second clock cycle prior to the first clock cycle. This embodiment of the method further includes determining a CRC value for the first clock cycle by combining the values of the first and second functions for the first clock cycle.

BRIEF DESCRIPTION OF THE DRAWINGS

The disclosed subject matter may be understood by reference to the following description taken in conjunction with the accompanying drawings, in which like reference numerals identify like elements, and in which.

Figure 1:
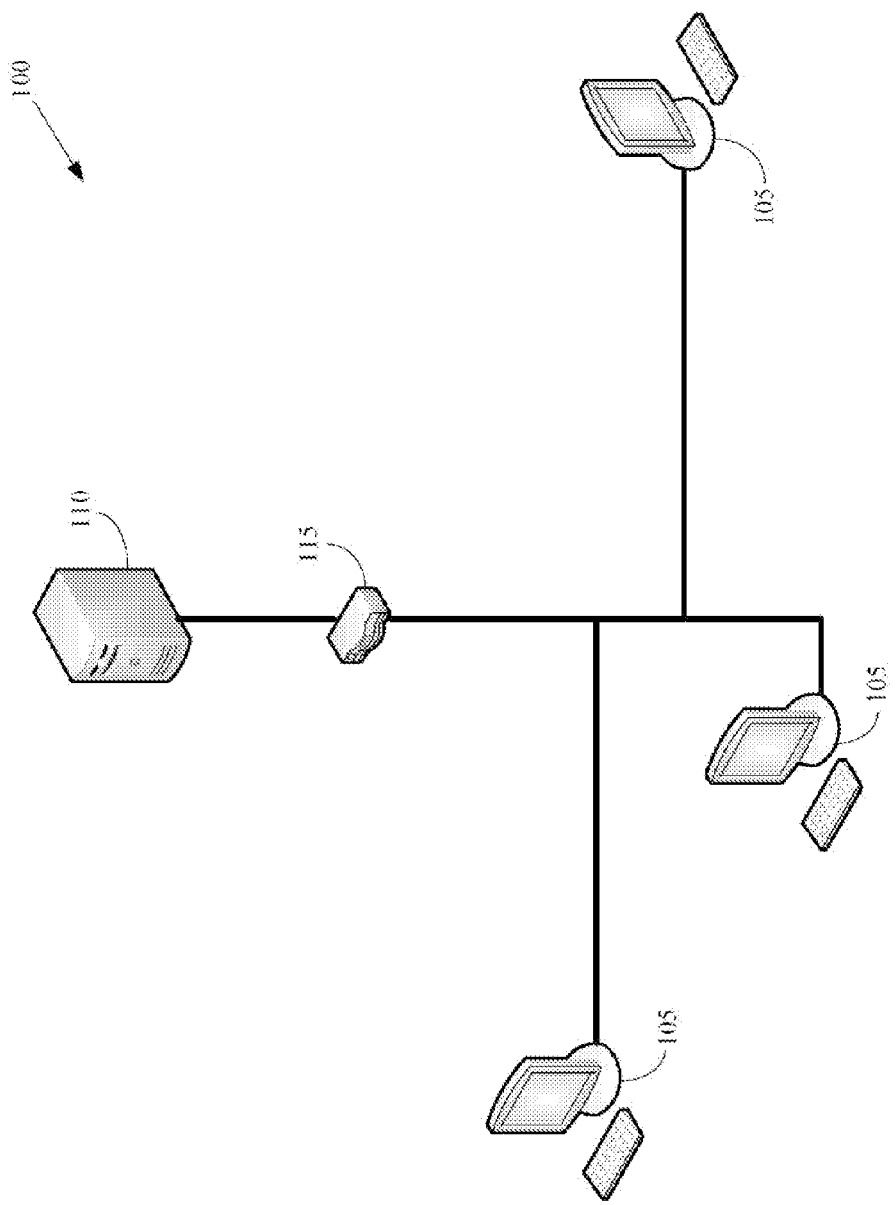
FIG. 1 conceptually illustrates a first exemplary embodiment of a packet-based network of processor-based systems.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. The description and drawings merely illustrate the principles of the claimed subject matter. It should thus be appreciated that those skilled in the art may be able to devise various arrangements that, although not explicitly described or shown herein, embody the principles described herein and may be included within the scope of the claimed subject matter. Furthermore, all examples recited herein are principally intended to be for pedagogical purposes to aid the reader in understanding the principles of the claimed subject matter and the concepts contributed by the inventor(s) to furthering the art, and are to be construed as being without limitation to such specifically recited examples and conditions.

The disclosed subject matter is described with reference to the attached figures. Various structures, systems and devices are schematically depicted in the drawings for purposes of explanation only and so as to not obscure the description with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition is expressly set forth in the specification in a definitional manner that directly and unequivocally provides the special definition for the term or phrase. Additionally, the term, "or," as used herein, refers to a non-exclusive "or," unless otherwise indicated (e.g., "or else" or "or in the alternative"). Also, the various embodiments described herein are not necessarily mutually exclusive, as some embodiments can be combined with one or more other embodiments to form new embodiments.

As discussed herein, logic functions such as CRC calculations performed by interfaces for a packet-based network may be required to process input values and feedback values in a single clock cycle. Conventional logic functions use a single logic block to calculate output values using the input data and the feedback. However, increasing the width of a parallel data path that provides input data to the logic functions can make it difficult or impossible for the conventional logic function to complete its operation and store an output value in a register in a single clock cycle. For example, CRC calculations can be performed using lookup tables (LUT) that calculate exclusive-OR (XOR) values from input values. A typical LUT can compute the XOR of four input values. Thus, computing the CRC value for 32 bits of input data and the corresponding feedback requires three logic levels of LUTs and computing the CRC value for 128 bits of input data and the corresponding feedback requires four logic levels of LUTs.

Larger numbers of logic levels require more time to compute the output value, but the clock frequency limits the amount of time that is available to perform the calculation. For example, the duration of a clock cycle is 8 ns when the clock frequency is 125 MHz. Designs that implement too many logic levels in a logic function that also processes feedback may not be able to meet the stringent timing requirements. For example, a single CRC logic block may not be able to compute CRC values for 128 bits of parallel input data within a single clock cycle of 8 ns. Increasing the clock frequency may further reduce the time available to perform calculations in a clock cycle.

Embodiments of the techniques described herein may address some or all of the deficiencies in the conventional practice by decomposing a first function (such as a CRC calculation) into second and third functions. A current value of the first function can then be recursively calculated by combining the second function of a current value of input data and the third function of a previous value of the first function. Values of the second and third functions can then be combined using an associative or commutative logic function such as an exclusive-OR (XOR) function. In one embodiment, the first function is $F(D_n, C_{n-1}) = f_d(D_n)$ xor $f_c(C_{n-1})$, the second function is $f_d$, the third function is $f_c$, the current (clock cycle n) input data is $D_n$, and the previous (clock cycle n−1) value of F is $C_{n-1}$. The second and third functions are combined using XOR. This embodiment may be used to compute CRC values from input data and feedback values of previously calculated CRC values.

The second function can be calculated using lookup tables that apply the second function to a selected number of inputs to produce an output value. For example, the second function may compute XOR of a selected number of the inputs using a plurality of pipeline stages. Each pipeline stage computes the XOR value from a subset of the selected number of inputs and is configurable to complete calculation of the logic function in a single clock cycle. In some embodiments, the third function may also be applied to previous values of the first function in a plurality of pipeline stages and each of these pipeline stages is configurable to complete their calculation in a single clock cycle. For example, multiple applications of the third function may allow the current values of the first function to be determined based on values of the first function that were calculated two or more clock cycles ago. In the case of a CRC calculation, current values of the CRC may be calculated using a CRC generator function to derive the functional relations: $C_n = F(D_n, D_{n-1}, C_{n-2}) = f_d(D_n)$ xor $(f_d(D_{n-1}))$ xor $f_c(f_c(C_{n-2}))$.

FIG. 1 conceptually illustrates a first exemplary embodiment of a packet-based network 100 of processor-based systems. In the illustrated embodiment, the network 100 includes a plurality of processor-based systems 105 that are interconnected to a server 110 using a router 115. Exemplary processor-based systems 105 include desktop computers, laptop computers, netbook computers, tablets, smart phones, and the like. The communication link between the processor-based systems 105, the server 110, or the router 115 may be formed using wired connections, wireless connections, or a combination thereof. In alternative embodiments, the network 100 may include other devices such as switches, hubs, routers, and the like that are not depicted in FIG. 1 in the interest of clarity. Each of the processor-based systems 105, as well as the server 110 or the router 115, may include interfaces to support physical, electromagnetic, or communicative coupling to the network 100. The interfaces may function as source interfaces for data being transmitted onto the network 100 or destination interfaces for data being received from the network 100.

Figure 2:
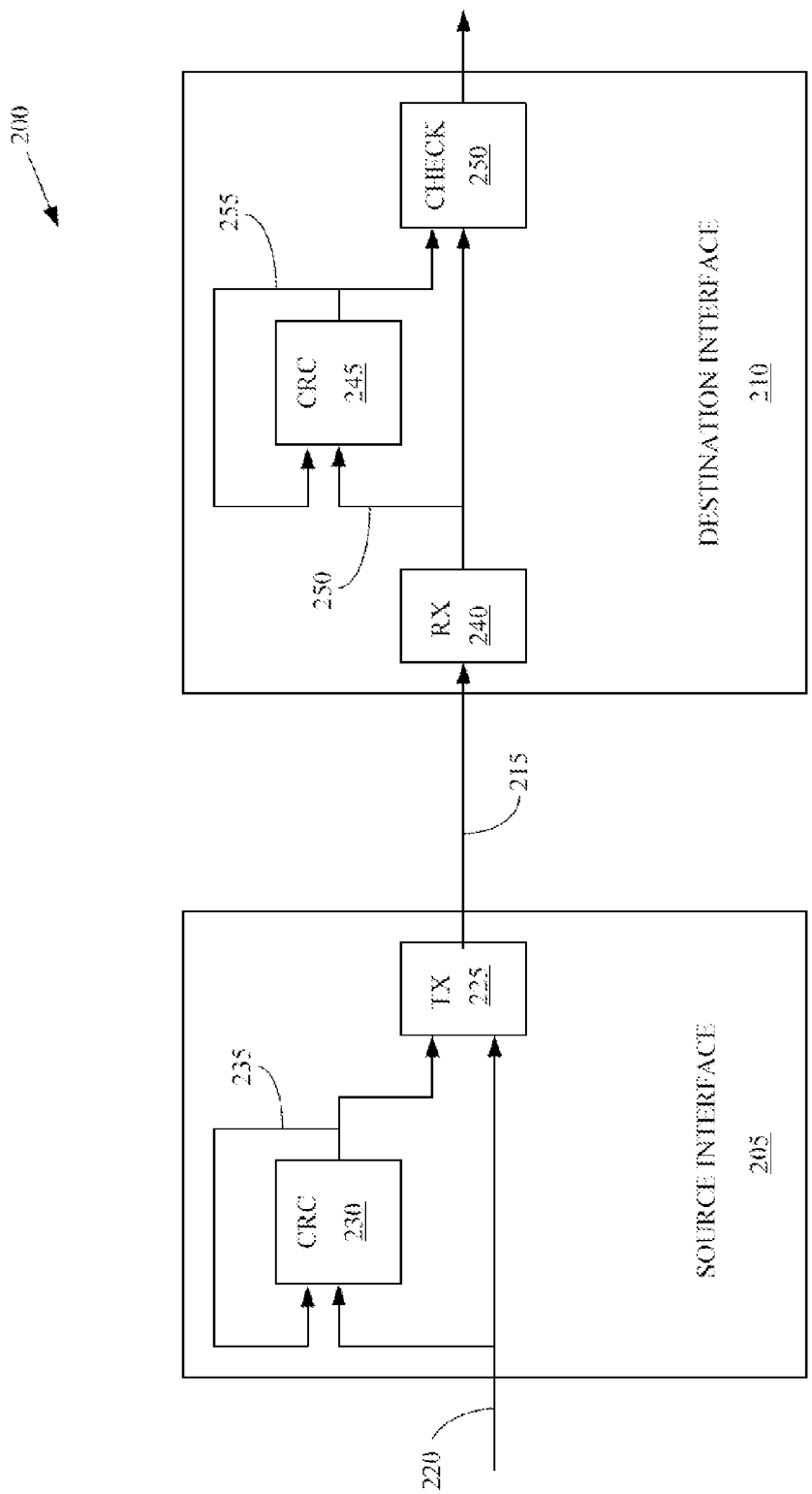
FIG. 2 conceptually illustrates a second exemplary embodiment of a packet-based network that includes a source interface and a destination interface.

FIG. 2 conceptually illustrates a second exemplary embodiment of a packet-based network 200 that includes a source interface 205 and a destination interface 210. Embodiments of the source interface 205 or the destination interface 210 may be implemented in processor-based systems such as the processor-based systems 105 or other devices depicted in FIG. 1. Alternatively, the source interface 205 and the destination interface 210 may be implemented within a single processor-based system to support communication between different portions of the single processor-based system. In the illustrated embodiment, the source interface 205, the destination interface 210, and a communication link 215 between these devices operate according to Ethernet standards or protocols. However, persons of ordinary skill in the art having benefit of the present disclosure should appreciate that other communication standards or protocols such as GFP or 10G-EPON may be implemented in addition to or instead of the Ethernet standards.

In the illustrated embodiment, the source interface 205 receives input data 220 for transmission to the destination interface 210 via one or more input ports. The input data 220 may be conveyed to a transmitter 225 for transmission over the communication link 215. Data may be lost or corrupted during transmission over the communication link 215 and so the illustrated embodiment of the source interface 205 includes error checking or correction logic such as a cyclic redundancy check (CRC) block 230. The CRC block 230 calculates output CRC values by applying a configurable generator function to the input data 220 and feedback 235 of previously calculated CRC values. The output CRC values may be provided to the transmitter 225 for transmission over the communication link 215 with the corresponding input data 220.

The illustrated embodiment of the destination interface 210 includes a receiver 240 that can receive the transmitted data and the corresponding CRC values via one or more ports. The received data can be conveyed to error checking or correction logic such as a CRC block 245. The CRC block 245 calculates output CRC values by applying the same configurable generator function implemented in CRC block 230 to the received data 250 and feedback 255 of previously calculated CRC values. The CRC block 245 may provide the output CRC values to check logic 260, which may compare the received CRC values to the output CRC values calculated by the CRC block 245. As long as these values match, the check logic 260 assumes that the received data 250 is uncorrupted and passes the received data 250 on to other circuitry. However, if the values do not match, the check logic 260 determines that there is an error in the received data 250. The check logic 260 (or other error correction logic) may then take corrective action including detecting or correcting the errors in the received data 250. Error correction techniques are known in the art and in the interest of clarity are not discussed further herein.

Persons of ordinary skill in the art having benefit of the present disclosure should appreciate that the source interface 205 and the destination interface 210 may include delay circuitry that can be configured to provide the appropriate time alignment within the circuits. For example, the source interface 205 may include delay circuitry configurable so that the input data 220, the feedback 235, and the output CRC values have the appropriate time alignment. For another example, the destination interface 210 may include delay circuitry that can be configured to provide time alignment between the received data 250, the feedback 255, and the output CRC values. Configuring the delay circuitry should be a routine undertaking for persons of ordinary skill in the art and, in the interest of clarity, the delay circuitry is not depicted in FIG. 2.

Calculations performed on the input data 220 and the corresponding feedback 235 may be pipelined to satisfy timing or clock requirements and the network 200. In the illustrated embodiment, portions of the CRC block 230 are pipelined so that each stage of the pipelines in the CRC block 230 can meet the timing or clock requirements imposed by the network 200. In the illustrated embodiment, portions of the CRC block 245 are also pipelined so that each stage of the pipelines in the CRC block 245 can meet the timing or clock requirements imposed by the network 200. Embodiments of CRC blocks 230, 245 including the pipelines are discussed in detail herein. Pipelining of logic in the source interface 205 or the destination interface 210 may be more important as the parallelism of the input data 220 increases.

Figure 3:
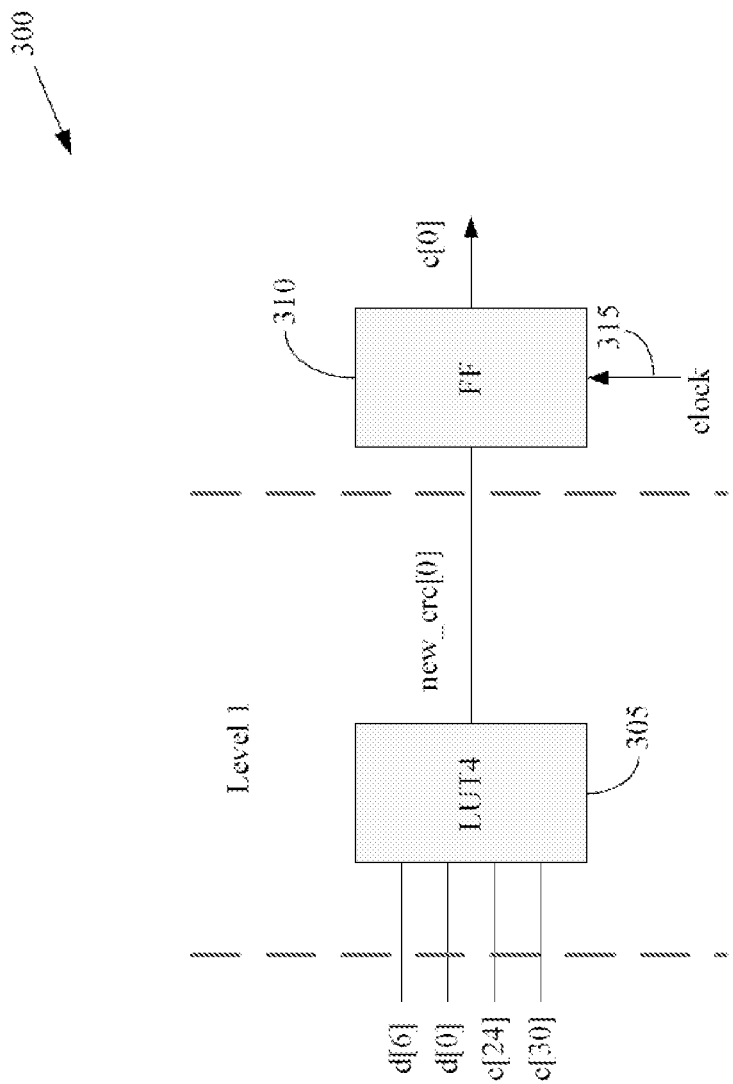
FIG. 3 conceptually illustrates one exemplary embodiment of CRC logic that can be used to calculate output CRC values for eight parallel bits of input data.

FIG. 3 conceptually illustrates one exemplary embodiment of CRC logic 300 that can be used to calculate output CRC values for eight parallel bits of input data. The portion of the CRC logic 300 shown in FIG. 3 is used to calculate bit 0 (e.g., c[0]) of the output CRC values. Additional portions (not shown) of the illustrated embodiment of the CRC logic 300 may be used to concurrently calculate the other bits of the output CRC values for the eight bits of input data. In the illustrated embodiment, the new output value of bit 0 is calculated using the generator function:

$$\text{newcrc}[0]=d[6]\,\hat{}\,d[0]\,\hat{}\,c[24]\,\hat{}\,c[30] \quad (1)$$

where d[i] are the eight input data bits, c[i] are previously calculated values of the CRC bits, and the "^" operator represents exclusive-OR. Persons of ordinary skill in the art having benefit of the present disclosure should appreciate that equation (1) and the generator function used to derive equation (1) are exemplary and alternative embodiments may use alternative generator functions or equations to calculate newcrc[0]. In the illustrated embodiment, a look up table 305 is used to calculate the new output value newcrc[0]. The look up table 305 is physically, electromagnetically, or communicatively coupled to a register that includes a flip-flop 310. The new output values can be clocked into the flip-flop 310 in response to the clock signal 315 and the stored CRC value c[0] can be read out by other circuits.

The illustrated embodiment of the CRC logic 300 includes a single logic level (Level 1) and the calculation of the CRC values can be performed by a single lookup table 305. The calculation performed by the look up table 305 may therefore be completed and stored in the flip-flop 310 in less time that would be required by more complicated circuits such as circuits that include more logic levels or more lookup tables.

Figure 4:
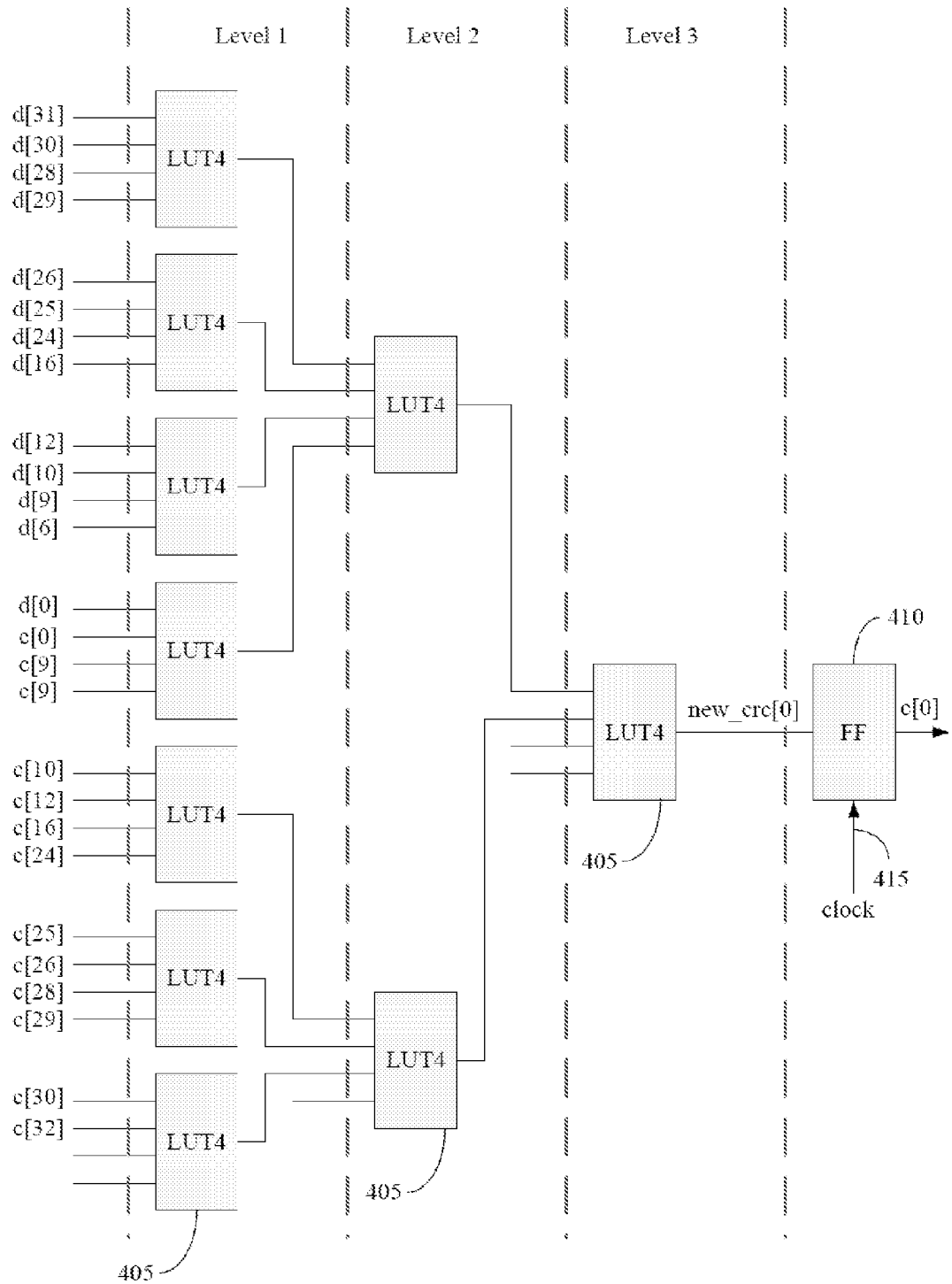
FIG. 4 conceptually illustrates one exemplary embodiment of CRC logic that can be used to calculate CRC values for 32 parallel bits of input data.

FIG. 4 conceptually illustrates one exemplary embodiment of CRC logic 400 that can be used to calculate CRC values for 32 parallel bits of input data. The portion of the CRC logic 400 shown in FIG. 4 is used to calculate bit 0 (e.g., c[0]) of the output CRC values. Additional portions (not shown) of the illustrated embodiment of the CRC logic 400 may be used to concurrently calculate the other bits of the output CRC values for the 32 bits of input data. In the illustrated embodiment, the new output value of bit 0 is calculated using the formula derived from an exemplary CRC generator function:

$$\begin{aligned}\text{newcrc}[0]=&d[31]\,\hat{}\,d[30]\,\hat{}\,d[29]\,\hat{}\,d[28]\,\hat{}\,d[26]\,\hat{}\,d[25]\,\hat{}\,d\\&[24]\,\hat{}\,d[16]\,\hat{}\,d[12]\,\hat{}\,d[10]\,\hat{}\,d[9]\,\hat{}\,d[6]\,\hat{}\,d[0]\,\hat{}\,c[0]\,\hat{}\,c\\&[6]\,\hat{}\,c[9]\,\hat{}\,c[10]\,\hat{}\,c[12]\,\hat{}\,c[16]\,\hat{}\,c[24]\,\hat{}\,c[25]\,\hat{}\,c[26]\,\hat{}\,c\\&[28]\,\hat{}\,c[29]\,\hat{}\,c[30]c[31]\end{aligned} \quad (2)$$

where d[i] are the 32 input data bits, c[i] are previously calculated values of the CRC bits, and the "^" operator represents exclusive-OR. Persons of ordinary skill in the art having benefit of the present disclosure should appreciate that equation (2) and the generator function used to derive equation (2) are exemplary and alternative embodiments may use alternative generator functions or equations to calculate newcrc[0]. In the illustrated embodiment, multiple look up tables 405 (only one per logic level is indicated by a reference numeral in the interest of clarity) are used to calculate the new output value newcrc[0]. The look up tables 405 are physically, electromagnetically, or communicatively interconnected in a hierarchy and the final look up table 405 is physically, electromagnetically, or communicatively coupled to a flip-flop 410. The new output values can be clocked into the flip-flop 410 in response to the clock signal 415 and then the stored CRC value c[0] can be read out by other circuits.

The illustrated embodiment of the CRC logic 400 includes three logic levels (Level 1, Level 2, and Level 3) and the calculation of the CRC values is performed by a hierarchy of logical elements that includes at least ten lookup tables 405. The calculation performed by the CRC logic 400 may therefore be completed and stored in the flip-flop 410 in more time than would be required by less complicated circuits such as circuits that include fewer logic levels or fewer lookup tables. For example, the CRC calculation performed by the CRC logic 400 may take at least three times as long as the CRC calculation performed by the CRC logic 300 depicted in FIG. 3. Consequently, the CRC logic 400 is significantly more constrained by timing or clock requirements. However, the CRC logic 400 can be pipelined, in which case the constraints may be reduced because the entire CRC logic 400 does not need to be completed in a single clock cycle. Instead, each pipeline stage can separately satisfy the timing requirement by completing its operations in a single clock cycle. For example, separate pipeline stages can be used to perform the calculations in Level 1, Level 2, and Level 3.

Figure 5:
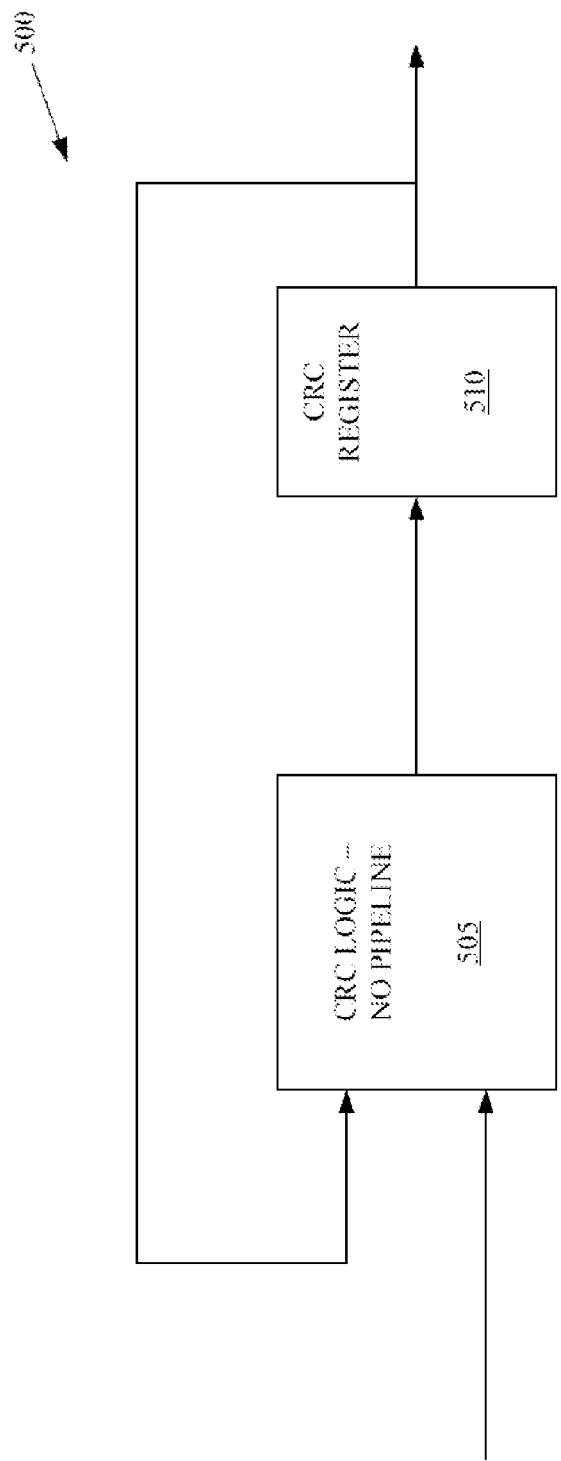
FIG. 5 conceptually illustrates a first exemplary embodiment of a CRC block.

FIG. 5 conceptually illustrates a first exemplary embodiment of a CRC block 500. In the illustrated embodiment, the CRC block 500 includes CRC logic 505 and a CRC register 510 for storing output CRC values. The CRC logic 505 is configured to calculate output CRC values by applying generator functions to input values and feedback values of previously calculated CRC values that are stored in the CRC register 510. In the first exemplary embodiment, the CRC logic 505 is not pipelined and calculations of the output values are performed in a single clock cycle.

Figure 6:
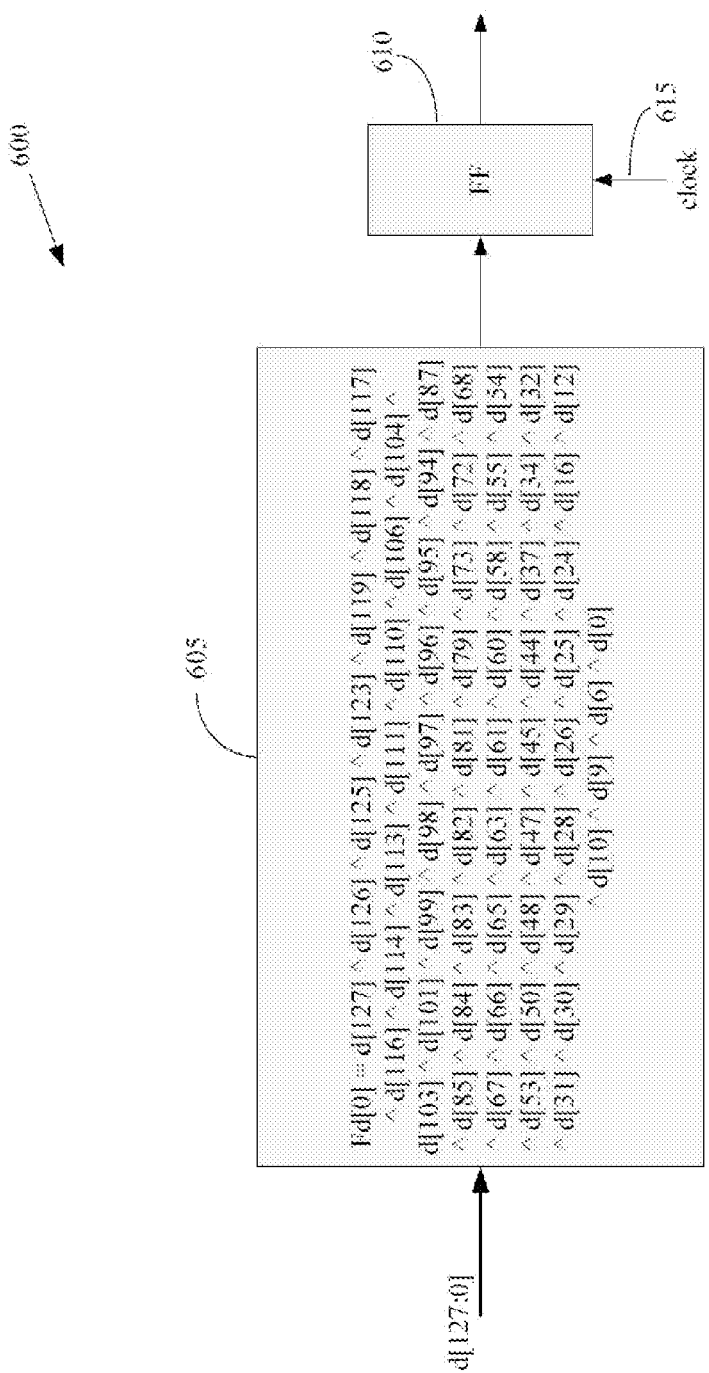
FIG. 6 conceptually illustrates the CRC calculation performed on input data by the first exemplary embodiment of the CRC block depicted in FIG. 5.

FIG. 6 conceptually illustrates the CRC calculation 600 performed on input data by the first exemplary embodiment of the CRC block 500 depicted in FIG. 5. Portions of the CRC calculation performed on the feedback CRC values are not depicted in FIG. 6. In the illustrated embodiment, the CRC calculation is performed on 128 bits of parallel input data in the logic block 605. The output CRC value generated by logic block 605 is the CRC value for bit 0. Results of the calculation are clocked into the flip-flop 610 in response to the clock signal 615. As discussed herein, performing the CRC calculation 600 on 128 parallel bits of input data may require more time than is available within a clock cycle.

Figure 7:
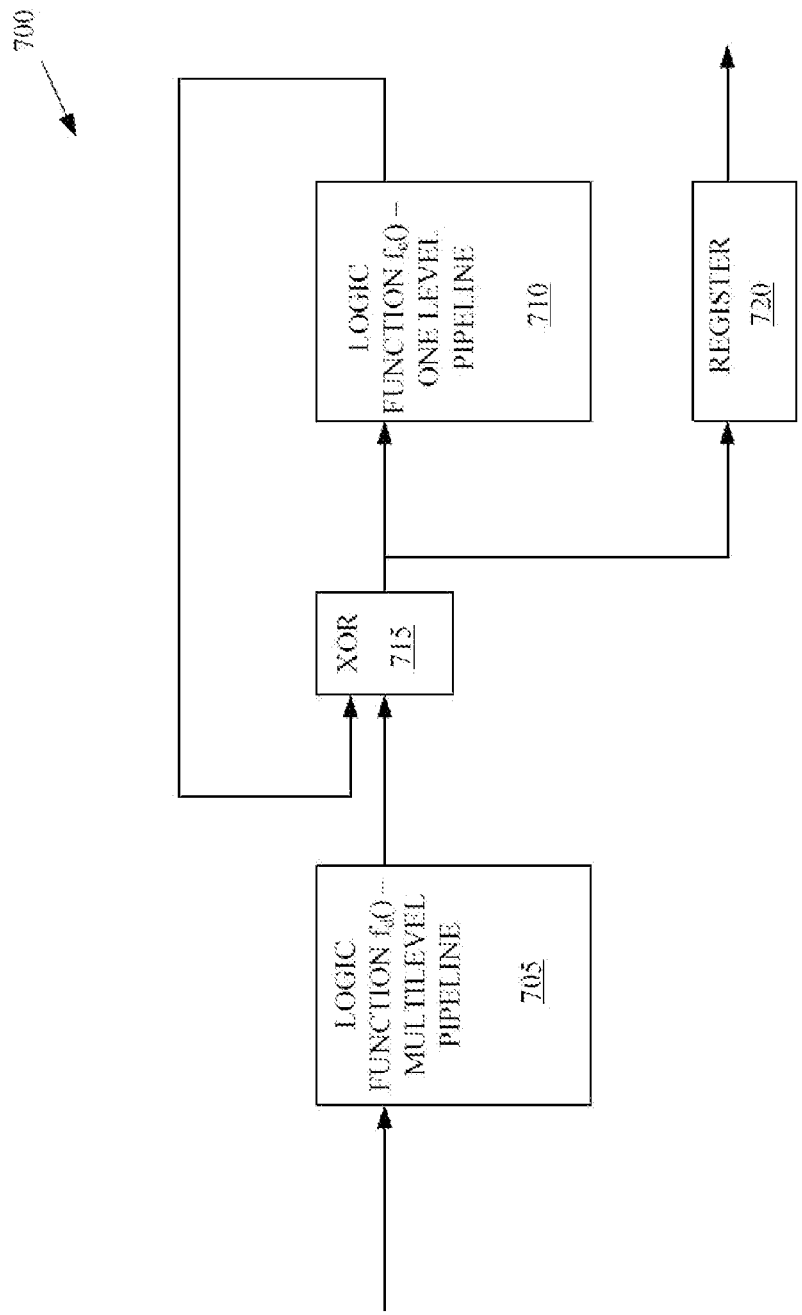
FIG. 7 conceptually illustrates a second exemplary embodiment of a CRC block.

FIG. 7 conceptually illustrates a second exemplary embodiment of a CRC block 700. In the illustrated embodiment, calculation of the output CRC values may be decomposed into a first calculation performed on the parallel input data and a second function performed on previously calculated CRC values. The second exemplary embodiment of the CRC block 700 therefore includes a first logic function ($f_d$) 705 that is applied to the parallel input data and a second logic function ($f_c$) 710 that is applied to the previously calculated CRC values. The first and second logic functions 705, 710 may be derived from a corresponding generator function. The results of the first and second logic function 705, 710 can be combined using an associative or commutative function such as the exclusive-OR block 715. The combined value can then be output or clocked into a register 720.

Embodiments of the CRC block 700 may include delay circuitry that is configured to maintain the appropriate time alignment of information used to perform the calculations described herein. In the interest of clarity, delay circuitry is not depicted in FIG. 7. However, persons of ordinary skill in the art having benefit of the present disclosure should be able to implement the appropriate delay circuitry.

In the illustrated embodiment, the CRC block 700 is configured to calculate current CRC values, $C_n$, for the current clock cycle (n) using the formula:

$$C_n = f_d(D_n) \operatorname{xor} f_c(C_{n-1}) \quad (3)$$

where $C_{n-1}$ denotes the previous CRC value that was calculated during the clock cycle n–1, $f_d(D_n)$ denotes the logic function applied to the input parallel data, the parallel input data is $D_n$, and $f_c(C_{n-1})$ denotes the logic function applied to the previously calculated CRC values $C_{n-1}$. The logic function $f_d(D_n)$ does not operate on the feedback signals and so this function can be computed using pipeline stages and corresponding registers. As discussed herein, the logic functions may be derived from corresponding generator functions. Only the individual pipeline stages need to satisfy the timing or clock requirements and so the full calculation of the current CRC value may be performed by the pipeline stages over more than one clock period.

In the illustrated embodiment, the logic function $f_c(C_{n-1})$ is processed in one clock cycle. However, the absence of input parallel data in the calculation of the logic function $f_c(C_{n-1})$ may allow this function to be completed in a shorter time interval. In one embodiment, the logic function $f_c(C_{n-1})$ may be implemented using 3 or 5 ports of a field programmable gate array (FPGA) implementation that can take advantage of available LUT inputs to reduce the time required to complete the computation. For example, FPGA implementations may include a 4 input LUT or a 6 input LUT. Moreover, pipeline stages can be added to overcome the timing limitations imposed by the clock frequency when the bit width of input parallel data is increased. Consequently, embodiments of the CRC block 700 described herein can be scaled to support any bit width of input parallel data.

Figure 8:
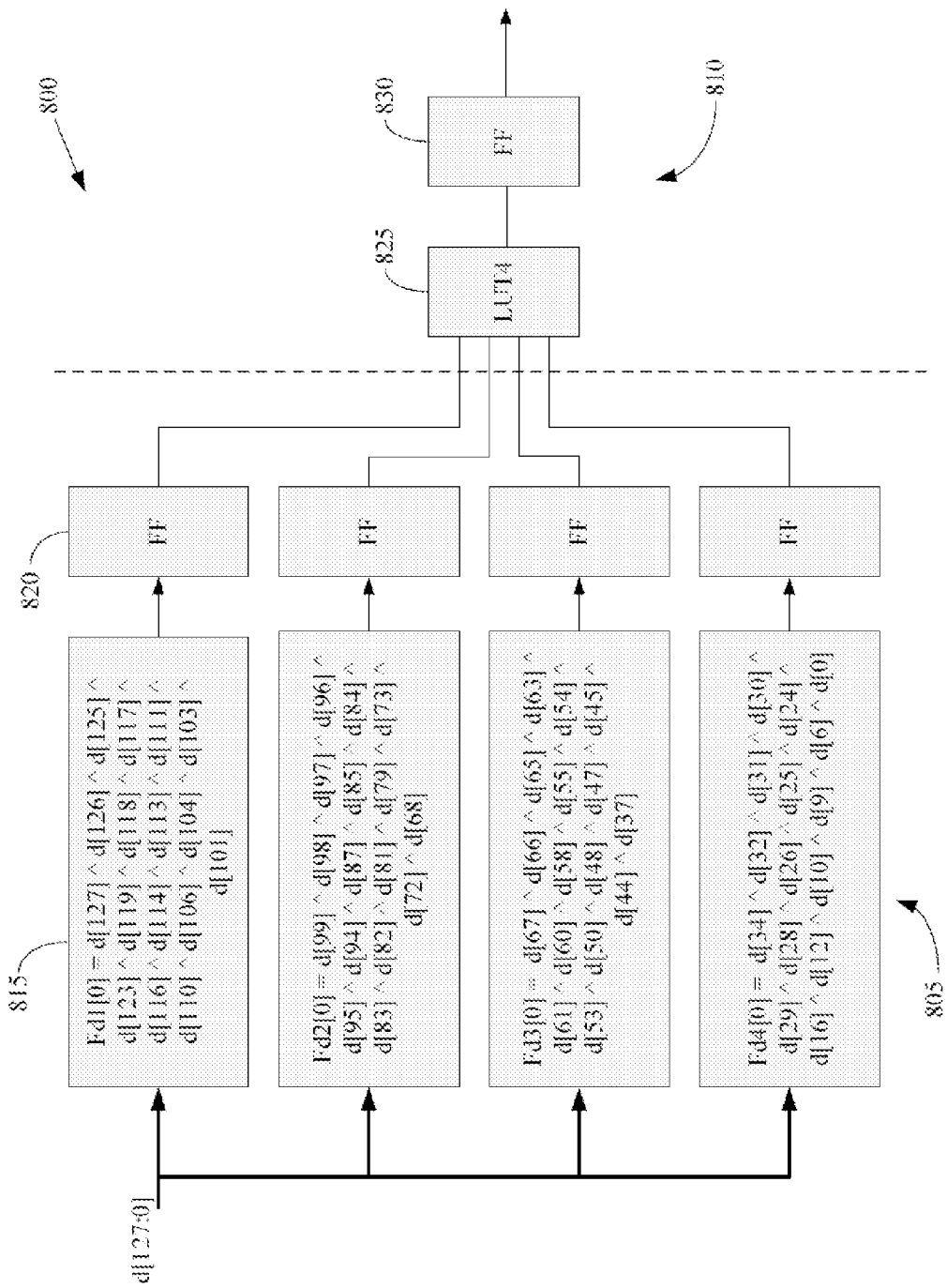
FIG. 8 conceptually illustrates one embodiment of a CRC calculation performed on input data by the first logic function in the second exemplary embodiment of the CRC block depicted in FIG. 7.

FIG. 8 conceptually illustrates one embodiment of a CRC calculation 800 performed on input data by the first logic function ($f_d$) 705 in the second exemplary embodiment of the CRC block 700 depicted in FIG. 7. Portions of the CRC calculation performed on the feedback CRC values are not depicted in FIG. 8. In the illustrated embodiment, the CRC calculation is performed on 128 bits of parallel input data and the output CRC value generated by the CRC calculation 800 is the CRC value for bit 0. The calculation performed by the illustrated embodiment of the CRC calculation 800 is the same as the calculation performed by the CRC calculation 600 depicted in FIG. 6. However, the calculation 800 differs from the calculation 600 because the illustrated embodiment of the CRC calculation 800 is performed in two pipeline stages 805, 810. The calculations performed by each pipeline stage 805, 810 may be performed in a clock cycle.

The pipeline stage 805 includes four logic blocks 815 that perform portions of the CRC calculation 800 concurrently or in parallel. Each of the four logic blocks 815 performs a subset of the exclusive-OR calculation used to generate the output CRC value. Since the exclusive-OR calculation is associative and commutative, the different portions of the CRC calculation 800 can be performed separately in the logic blocks 815 and then subsequently combined to generate the same output value that is produced when the calculation is performed in a single logic block. The pipeline stage 805 also includes four registers or flip-flops 820 for storing the output values generated by the corresponding logic blocks 815. In the illustrated embodiment, the output values from the logic blocks 815 may be clocked into the flip-flops 820 in response to the clock signal for the circuit.

The pipeline stage 810 includes a logic block 825 that combines the output values generated by the logic blocks 815 in the previous pipeline stage 805. In the illustrated embodiment, the logic block 825 is implemented as a look up table that performs an exclusive-OR operation on the output values that are read out from the flip-flops 820. The output value generated by the logic block 825 may then be clocked into flip-flop 830. The value stored in the flip-flop 830 represents the bit-0 portion of the CRC calculation 800 for the parallel input data. In the illustrated embodiment, the stage 810 can perform its calculation and store the output result in the flip-flop 830 in one clock cycle.

Figure 9:
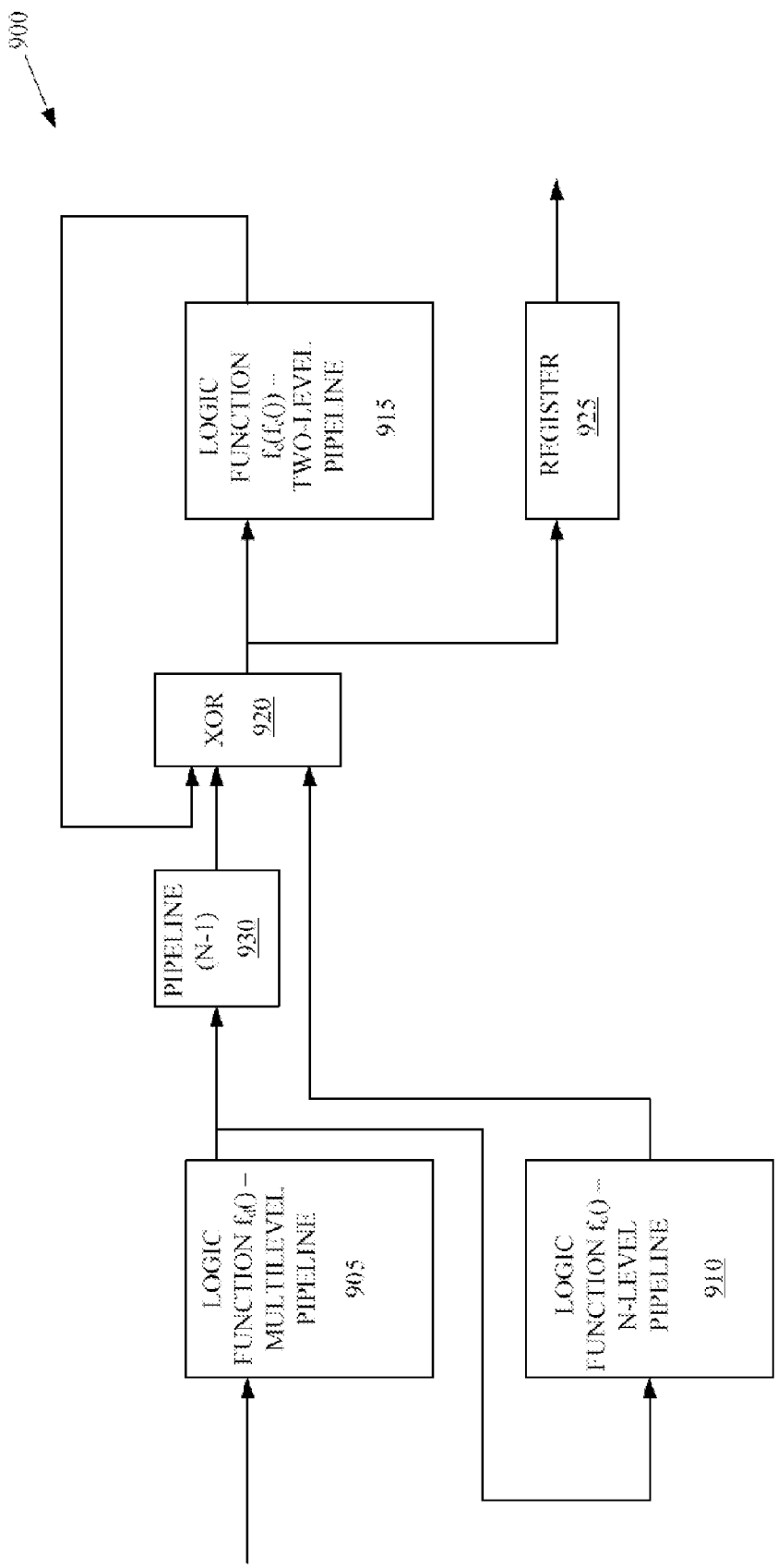
FIG. 9 conceptually illustrates a third exemplary embodiment of a CRC block.

FIG. 9 conceptually illustrates a third exemplary embodiment of a CRC block 900. In the illustrated embodiment, calculation of the output CRC values may be decomposed into a first calculation performed on the parallel input data for a current clock cycle, a second function performed on parallel input data from the previous clock cycle, and a third function performed on CRC values calculated two clock cycles earlier than the current clock cycle. The third exemplary embodiment of the CRC block 900 therefore includes a first logic function ($f_d$) 905 that is applied to the parallel input data and a second logic function ($f_c(f_d(\ ))$) 910 that is applied to the parallel input data from the previous clock cycle. The third exemplary embodiment of the CRC block 900 also includes a third logic function ($f_c(f_c)$) 915 that performs the second logic function twice in a nested manner on CRC values calculated two clock cycles earlier than the current clock cycle. The results of the first, second, and third logic functions 905, 910, 915 can be combined using an associative or commutative function such as the exclusive-OR block 920. The combined value can then be output or clocked into a register 925.

The CRC block 900 may include additional pipeline stages 930 between the logic 905 and the exclusive-OR block 920. In the illustrated embodiment, the logic 905 provides output to (N–1) pipeline stages 930 to help preserve or maintain alignment of data output from the pipeline stages in the logic blocks 905, 910 before this data is asserted to the exclusive- OR block 920. Embodiments of the CRC block 900 may also include delay circuitry that is configured to maintain the appropriate time alignment of information used to perform the calculations described herein. In the interest of clarity, delay circuitry is not depicted in FIG. 9. However, persons of ordinary skill in the art having benefit of the present disclosure should be able to implement the appropriate delay circuitry.

In the illustrated embodiment, the CRC block 900 can calculate current CRC values, $C_n$, for the current clock cycle (n) using the formula:

$$C_n = f_d(D_n) \operatorname{xor} f_c(f_d(D_{n-1}) \operatorname{xor} f_c(C_{n-2})) \quad (4)$$

where $C_{n-2}$ denotes the CRC value that was calculated during the clock cycle n−2, $f_d(D_n)$ denotes the logic function applied to the input parallel data, the parallel input data for the current clock cycle is $D_n$, the parallel input data from the previous clock cycle is $D_{n-1}$, and $f_c(C_{n-2})$ denotes the logic function applied to the previously calculated CRC values $C_{n-2}$. Equation (4) may be derived by applying nested iterations of equation (3) to generate CRC values for successive clock cycles. The associative properties of the functions can be used to verify that:

$$f_c(f_d(D_{n-1}) \operatorname{xor} f_c(C_{n-2})) = f_c(f_d(D_{n-1})) \operatorname{xor} f_c(f_c(C_{n-2})) \quad (5)$$

and consequently:

$$C_n = f_d(D_n) \operatorname{xor} f_c(f_d(D_{n-1})) \operatorname{xor} f_c(f_c(C_{n-2})). \quad (6)$$

The structure of formula (6) indicates that the current CRC value can be calculated from current data ($D_n$), data from the previous clock cycle ($D_{n-1}$), and the CRC values calculated two clock cycles earlier ($C_{n-2}$).

The logic functions $f_d(D_n)$ and $f_c(f_d(D_{n-1}))$ operate on the data signals ($D_n$) or ($D_{n-1}$) and not on the feedback signals ($C_{n-2}$). Consequently, the logic blocks 905, 910 can divide the computation of these values over multiple pipeline stages and corresponding registers. For example, the logic block 905 may be implemented as a multilevel pipeline and the logic block 910 may be implemented as a one-level pipeline. Alternatively, the logic block 910 may also be implemented as a multilevel pipeline As discussed herein, only the individual pipeline stages in the logic blocks 905, 910 need to satisfy the timing or clock requirements. Consequently, these functions can be implemented with very high clock frequency by adding appropriate pipelines, as discussed herein.

The logic block 915 operates on the feedback signals ($C_{n-2}$) and not the data signals ($D_n$) or ($D_{n-1}$). Consequently, the logic block 915 may be implemented using a two level pipeline to perform the nested operations $f_c(f_c(\ ))$. Thus, the CRC value from two clock cycles earlier ($C_{n-2}$) may be processed in at least two clock cycles preceding or including the clock cycle that is two clock cycles earlier (n−2). The clock frequency of the CRC logic function part may therefore increase greatly as a consequence of decomposing the operations into the logic blocks 905, 910, 915, although iterations of $f_c$ are performed.

The maximum logic level of the function of $f_c(f_c(\ ))$ may be the same as the maximum logic level of the function $f_c(\ )$ when the input data width is sufficiently wide. The logic level of the function $f_c(f_c(\ ))$ performed on an input parallel data bit width of N may therefore be the same as the logic level of $f_c(\ )$ applied to an input parallel data bit width of 2*N. For the CRC-32 example, the functions $f_c(\ )$ or $f_c(f_c(\ ))$ may be implemented using an exclusive-OR operation to generate a 32 bit CRC value. In either case, the maximum logic level is 3. Increasing the input parallel data bit width may therefore allow the function $f_c(f_c(\ ))$ to be calculated using the same number of logic levels as the function $f_c(\ )$. However, if three logic levels are needed to implement $f_c(\ )$ and a single pipeline stage cannot perform the operations of the three logic levels within the time interval set by the duration of a clock cycle, then a two-stage pipeline may be used to implement the three logic levels of $f_c(f_c(\ ))$. In this embodiment, the logic level for each stage is less than 3 and may therefore be completed during the time interval.

Figure 10:
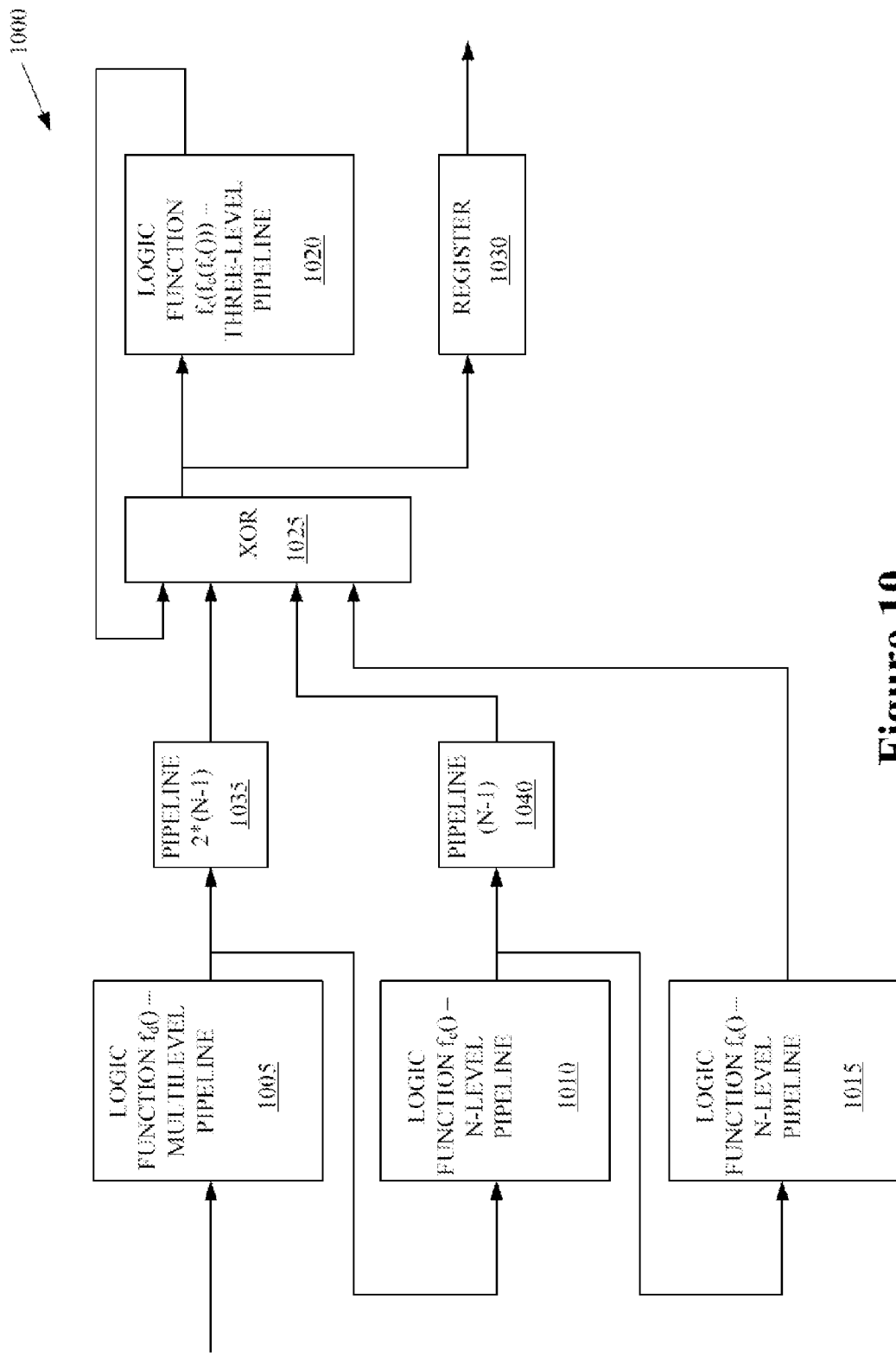
FIG. 10 conceptually illustrates a fourth exemplary embodiment of a CRC block.

FIG. 10 conceptually illustrates a fourth exemplary embodiment of a CRC block 1000. In the illustrated embodiment, calculation of the output CRC values may be decomposed into a first function performed on the parallel input data for a current clock cycle, a second function performed on parallel input data from the previous clock cycle, a third function performed on parallel input data from two clock cycles earlier than the current clock cycle, and a fourth function performed on CRC values calculated three clock cycles earlier than the current clock cycle. The fourth exemplary embodiment of the CRC block 1000 therefore includes a first logic function ($f_d$) 1005 that is applied to the parallel input data, a second logic function ($f_c$) 1010 that is applied to the parallel input data from the previous clock cycle, and a third logic function ($f_c$) 1015 that is applied to the parallel input data from the clock cycle two cycles earlier. The fourth exemplary embodiment of the CRC block 1000 also includes a fourth logic function ($f_c(f_c(f_c))$) 1020 that performs the second logic function three times in a nested manner. The results of the first, second, third, and fourth logic functions 1005, 1010, 1015, 1020 can then be combined using an associative or commutative function such as the exclusive-OR block 1025. The combined value can then be output or clocked into a register 1030.

The CRC block 1000 may include additional pipeline stages 1035, 1040 between the logic blocks 1005, 1010 and the exclusive-OR block 1025. In the illustrated embodiment, the logic 1005 provides output to 2*(N−1) pipeline stages 1035 and the logic 1010 provides output to (N−1) pipeline stages 1040 to help preserve or maintain alignment of data output from the pipeline stages in the logic blocks 1005, 1010, 1015 before this data is asserted to the exclusive-OR block 1025. Embodiments of the CRC block 1000 may also include delay circuitry that is configured to maintain the appropriate time alignment of information used to perform the calculations described herein. In the interest of clarity, delay circuitry is not depicted in FIG. 10. However, persons of ordinary skill in the art having benefit of the present disclosure should be able to implement the appropriate delay circuitry.

The second, third, and fourth functions used by the logic blocks 1010, 1015, 1020 can be derived by using multiple nested iterations of equation (3). As discussed herein, the logic functions blocks 1005, 1010, 1015 do not operate on the feedback signals and so the logic blocks 1005, 1010, 1015 can compute the values of these functions using multiple pipeline stages and corresponding registers. For example, the logic block 1005 may be implemented as a multilevel pipeline and the logic blocks 1010, 1015 may be implemented as one-level pipelines. Alternatively, one or more of the logic blocks 1010, 1015 may be implemented as a multilevel pipeline. The logic block 1020 operates on the feedback signals ($C_{n-3}$) and does not operate on the data signals. Consequently, the logic block 1020 may be implemented using a three level pipeline to perform the nested operations $f_c(f_c(f_c(\ )))$. As discussed herein, only the individual pipeline stages in the logic blocks 1005, 1010, 1015, 1020 need to satisfy the timing or clock requirements. Consequently, these functions can be implemented with very high clock frequency by adding appropriate pipelines, as discussed herein.

As discussed herein, the maximum logic level of the function of $f_c(f_c(f_c(\ )))$ may be the same as the maximum logic level of the function $f_c(\ )$ when the input data width is sufficiently wide. The logic level of the function $f_c(f_c(f_c(\ )))$ performed on an input parallel data bit width of N may therefore be the same as the logic level of $f_c(\ )$ applied to an input parallel data bit width of 3*N. As discussed herein, increasing the input parallel data bit width may therefore allow the function $f_c(f_c(f_c(\ )))$ to be calculated using the same number of logic levels as the function $f_c(\ )$. However, in some embodiments, additional pipeline stages may be used to implement $f_c(f_c(f_c(\ )))$ to meet the timing requirements.

In alternative embodiments, additional nested iterations of equation (3) may be used to generate different sets of functions that can be applied using additional logic blocks. For example, four nested iterations of equation (3) may be performed to generate functional representations that can be implemented in logic blocks that are applied to the current parallel input data, parallel input data from the previous clock cycle, parallel input data from two clock cycles earlier, parallel input data from three clock cycles earlier, and the CRC values computed four cycles earlier. These logic blocks may be pipelined in the manner discussed herein to address timing constraints associated with different parallel input data widths.'

Figure 11:
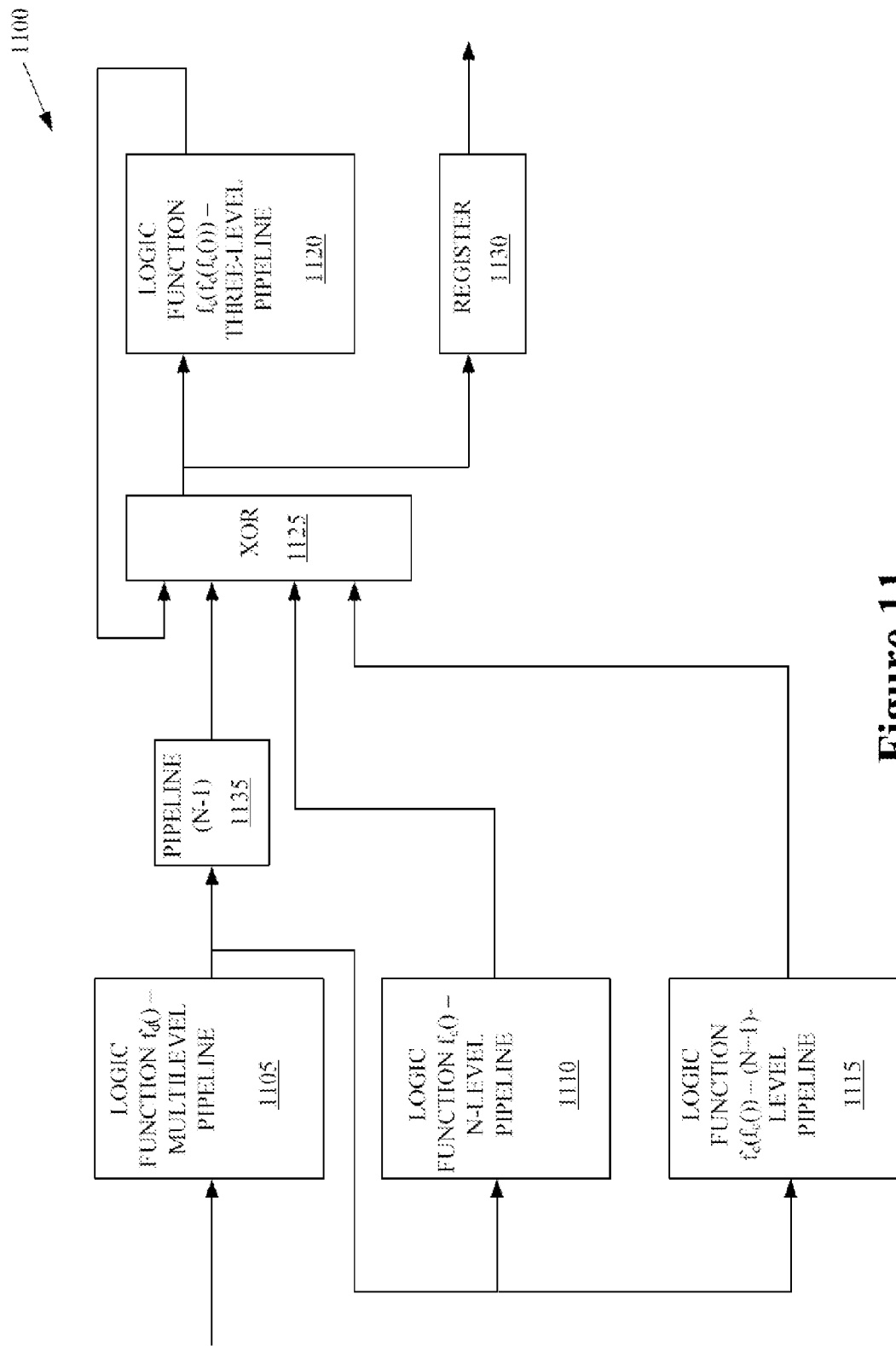
FIG. 11 conceptually illustrates a fifth exemplary embodiment of a CRC block.

FIG. 11 conceptually illustrates a fifth exemplary embodiment of a CRC block 1100. As discussed with regard to the fourth exemplary embodiment, calculation of the output CRC values may be decomposed into a first function performed on the parallel input data for a current clock cycle, a second function performed on parallel input data from the previous clock cycle, a third function performed on parallel input data from two clock cycles earlier than the current clock cycle, and a fourth function performed on CRC values calculated three clock cycles earlier than the current clock cycle. The fifth exemplary embodiment of the CRC block 1000 therefore includes a first logic function ($f_d$) 1105 that is applied to the parallel input data, a second logic function ($f_c$) 1110 that is applied to the parallel input data from the previous clock cycle, a third logic function ($f_c(f_c)$) 1115 that is applied to the parallel input data from the clock cycle two cycles earlier, and a fourth logic function ($f_c(f_c(f_c))$) 1120 that performs the second logic function three times in a nested manner. The results of the first, second, third, and fourth logic functions 1105, 1110, 1115, 1120 can then be combined using an associative or commutative function such as the exclusive-OR block 1125. The combined value can then be output or clocked into a register 1130.

The fifth exemplary embodiment of the CRC block 1100 differs from the fourth exemplary embodiment because the logic block 1115 uses an (N+1) level pipeline to calculate ($f_c(f_c)$) instead of an (N) level pipeline to calculate ($f_c$). In the illustrated embodiment, the CRC block 1100 may therefore include an additional pipeline stage 1135 between the logic block 1105 and the exclusive-OR block 1125. In the illustrated embodiment, the logic 1105 provides output to (N−1) pipeline stages 1035 to help preserve or maintain alignment of data output from the pipeline stages in the logic blocks 1105, 1110, 1115 before this data is asserted to the exclusive-OR block 1125. Embodiments of the CRC block 1100 may also include delay circuitry that is configured to maintain the appropriate time alignment of information used to perform the calculations described herein. In the interest of clarity, delay circuitry is not depicted in FIG. 11. However, persons of ordinary skill in the art having benefit of the present disclosure should be able to implement the appropriate delay circuitry.

The alternative embodiments depicted in FIGS. 9-11 may be used to satisfy more stringent timing requirements that may not be satisfied by the embodiment depicted in FIG. 7. For example, the logic block 710 uses a single pipeline stage to implement the function $f_c(\ )$. However, the single pipeline stage implemented in the logic block 710 may not be able to perform the required calculations in one clock cycle and so more clock cycles may be needed to implement the function $f_c(\ )$. In that case, alternative embodiments may use more pipeline stages to calculate the function $f_c(\ )$. The third exemplary embodiment increases the number of pipeline stages to two pipeline stages in the logic 915 so that calculation of the function $f_c(\ )$ can extend over two cycles. For example, if one additional clock cycle is added into logic 710, the input of 710 can be changed from $C_{n-1}$ to $C_{n-2}$ and the function $f_c(\ )$ can be changed to $f_c(f_c(\ ))$, as shown in FIG. 9. The fourth exemplary embodiment increases the number of pipeline stages to three pipeline stages in logic 1020 so that calculation of the function $f_c(\ )$ can extend over three clock cycles.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. An apparatus, comprising:
    a first logic circuit for determining a value of a first function based on input data for a first clock cycle, wherein the first logic circuit comprises a plurality of pipeline stages that perform subsets of calculations of the value of the first function in one clock cycle;
    a second logic circuit for determining a value of a second function for the first clock cycle based on a value of a third function for a second clock cycle prior to the first clock cycle; and
    a third logic circuit for determining a value of the third function for the first clock cycle by combining the values of the first and second functions for the first clock cycle.

2. The apparatus of claim 1, wherein the first logic circuit comprises a first pipeline stage comprising a plurality of lookup tables for computing output values using an exclusive-OR of subsets of the input data and at least one second pipeline stage comprising at least one lookup table for computing at least one output value using exclusive-OR of output values computed by a previous first or second pipeline stage.

3. The apparatus of claim 2, wherein the first pipeline stage and said at least one second pipeline stage comprise registers for storing the output values of the corresponding pipeline stage.

4. The apparatus of claim 3, wherein the lookup tables and registers in the first or second pipeline stages are configurable to compute and store the output values in one clock cycle.

5. The apparatus of claim 1, wherein the second logic circuit comprises at least one lookup table for computing an exclusive-OR using the value of the third function for the second clock cycle prior to the first clock cycle.

6. The apparatus of claim 1, wherein the third logic circuit is configurable to combine the values of the first and second functions for the first clock cycle using an associative or commutative function.

7. The apparatus of claim 6, wherein the third logic circuit comprises at least one look up table for computing an exclusive-OR using the values of the first and second functions for the first clock cycle.

8. The apparatus of claim 1, comprising at least one fourth logic circuit for determining at least one value of the second function for the first clock cycle based on a value of the first function for input data for at least one third clock cycle, wherein the second clock cycle is prior to said at least one third clock cycle and said at least one third clock cycle is prior to the first clock cycle.

9. The apparatus of claim 8, wherein the third logic circuit is configurable to determine a value of the third function for the first clock cycle by combining the values of the first function, the second function, and said at least one fourth function for the first clock cycle.

10. The apparatus of claim 1, wherein the value of the third function represents a cyclic redundancy check value for the input data.

11. An interface circuit, comprising:
    a plurality of ports for receiving parallel input data;
    a first logic circuit for determining a value of a first function based on the parallel input data for a first clock cycle, wherein the first logic circuit comprises a plurality of pipeline stages that perform subsets of calculations of the value of the first function in one clock cycle;
    a second logic circuit for determining a value of a second function for the first clock cycle based on a value of a third function for a second clock cycle prior to the first clock cycle;
    a third logic circuit for determining a value of the third function for the first clock cycle by combining the values of the first and second functions for the first clock cycle;
    at least one register for storing the value of the third function.

12. The interface circuit of claim 11, wherein the first logic circuit comprises a first pipeline stage comprising a plurality of lookup tables for computing output values using an exclusive-OR of subsets of the input data and at least one second pipeline stage comprising at least one lookup table for computing at least one output value using exclusive-OR of output values computed by a previous first or second pipeline stage.

13. The interface circuit of claim 11, wherein the second logic circuit comprises at least one lookup table for computing an exclusive-OR using the value of the third function for the second clock cycle prior to the first clock cycle.

14. The interface circuit of claim 11, wherein the third logic circuit comprises at least one look up table for computing an exclusive-OR using the values of the first and second functions for the first clock cycle.

15. The interface circuit of claim 11, wherein the value of the third function represents a cyclic redundancy check value for the parallel input data.

16. A method, comprising:
    determining a value of a first function based on input data for a first clock cycle, wherein the value of the first function is determined using a plurality of pipeline stages that perform subsets of calculations of the value of the first function in one clock cycle;
    determining a value of a second function for the first clock cycle based on a value of a third function for a second clock cycle prior to the first clock cycle; and
    determining a value of the third function for the first clock cycle by combining the values of the first and second functions for the first clock cycle.

17. The method of claim 16, wherein determining the value of the first function comprises determining output values of a first pipeline stage using an exclusive-OR of subsets of the input data and determining at least one output value of at least one second pipeline stage using exclusive-OR of output values computed by a previous first or second pipeline stage.

18. The method of claim 17, comprising storing the output values of the first pipeline stage or said at least one second pipeline stage.

19. The method of claim 18, wherein determining output values for the first or second pipeline stages and storing the corresponding output values is performed in one clock cycle.

20. The method of claim 16, wherein determining the value of the third function comprises determining a cyclic redundancy check value for the input data.

* * * * *